(12) United States Patent
Esaka et al.

(10) Patent No.: US 11,105,831 B2
(45) Date of Patent: Aug. 31, 2021

(54) CURRENT SENSOR

(71) Applicant: DENSO CORPORATION, Kariya (JP)

(72) Inventors: Takuma Esaka, Kariya (JP); Ryosuke Sakai, Kariya (JP); Tatsuaki Sugito, Kariya (JP)

(73) Assignee: DENSO CORPORATION, Kariya (JP)

( * ) Notice: Subject to any disclaimer, the term of this patent is extended or adjusted under 35 U.S.C. 154(b) by 64 days.

(21) Appl. No.: 16/583,506

(22) Filed: Sep. 26, 2019

(65) Prior Publication Data
US 2020/0025803 A1 Jan. 23, 2020

Related U.S. Application Data

(63) Continuation of application No. PCT/JP2018/011267, filed on Mar. 22, 2018.

(30) Foreign Application Priority Data

Apr. 26, 2017 (JP) .............................. JP2017-087362

(51) Int. Cl.
*G01R 1/16* (2006.01)
*G01R 15/14* (2006.01)

(52) U.S. Cl.
CPC ............. *G01R 15/148* (2013.01); *G01R 1/16* (2013.01)

(58) Field of Classification Search
CPC .... G01R 15/148; G01R 15/20; G01R 15/205; G01R 15/207; G01R 33/072; G01R 33/091; G01R 33/093; G01R 33/096; G01R 33/098
See application file for complete search history.

(56) References Cited

U.S. PATENT DOCUMENTS

| | | | | |
|---|---|---|---|---|
| 8,593,134 | B2 * | 11/2013 | Haratani | B82Y 25/00 324/117 R |
| 2008/0186021 | A1 * | 8/2008 | Hashio | G01R 15/207 324/225 |
| 2012/0293170 | A1 * | 11/2012 | Nakajima | G01R 15/207 324/252 |

(Continued)

FOREIGN PATENT DOCUMENTS

| | | |
|---|---|---|
| JP | 2010-044025 A | 2/2010 |
| JP | 2015-148470 A | 8/2015 |

(Continued)

*Primary Examiner* — Thang X Le
(74) *Attorney, Agent, or Firm* — Posz Law Group, PLC (57) ABSTRACT

A current sensor detects a current flowing through a current path. The current sensor includes plural sensor elements, and each sensor element has a current path, a magnetic detector, a first magnetic shield and a second magnetic shield. The magnetic detector faces a part of the current path. A part of the current path and the magnetic detector are positioned between the first and second magnetic shields. The second magnetic field, the current path, the magnetic detector and the first magnetic shield are stacked in order along a stacking direction in each sensor element. The plural sensor elements are disposed adjacently to each other in a direction perpendicular to the stacking direction. The current path has a facing part facing the magnetic detector, and a first bent part bending from the facing part toward the second magnetic shield.

6 Claims, 6 Drawing Sheets

(56) References Cited

U.S. PATENT DOCUMENTS

| | | | | |
|---|---|---|---|---|
| 2013/0057273 | A1* | 3/2013 | Ide | G01R 33/093 |
| | | | | 324/252 |
| 2015/0260762 | A1* | 9/2015 | Sakamoto | G01R 1/18 |
| | | | | 324/117 R |
| 2017/0082659 | A1* | 3/2017 | Harada | G01R 15/20 |
| 2017/0343584 | A1* | 11/2017 | Abe | G01R 15/148 |
| 2018/0031613 | A1* | 2/2018 | Nakayama | G01R 33/05 |

FOREIGN PATENT DOCUMENTS

| | | |
|---|---|---|
| JP | 2015-175757 A | 10/2015 |
| JP | 2016-065829 A | 4/2016 |
| JP | 2016-173306 A | 9/2016 |
| JP | 2016-178799 A | 10/2016 |
| JP | 2017-078577 A | 4/2017 |

\* cited by examiner

FIG. 8 COMPARATIVE EXAMPLE

FIG. 9 COMPARATIVE EXAMPLE

CURRENT SENSOR

CROSS REFERENCE TO RELATED APPLICATIONS

The present application is a continuation application of International Patent Application No. PCT/2018/011267 filed on Mar. 22, 2018, which designated the U.S. and claims the benefit of priority from Japanese Patent Application No. 2017-087362 filed on Apr. 26, 2017. The entire disclosures of all of the above applications are incorporated herein by reference.

TECHNICAL FIELD

The present disclosure relates to a current sensor.

BACKGROUND

A current sensor, which is used for current detection, includes a bus bar and a magnetic detection element. The magnetic detection element measures the strength of a magnetic field generated by a current flowing through the bus bar. The bus bar has a portion formed in a concave shape in a cross-sectional view and formed in a symmetrical shape with respect to the center in a width direction. The magnetic detection element is disposed in a space surrounded by the bus bar formed in the concave shape, and is disposed at the center of the bus bar in the width direction.

SUMMARY

The present disclosure describes a current sensor including plural sensor elements each having a current path, a magnetic detector, a first magnetic shield, and a second magnetic shield.

BRIEF DESCRIPTION OF DRAWINGS

The above and other objects, features and advantages of the present disclosure will become more apparent from the following detailed description made with reference to the accompanying drawings. In the drawings.

DETAILED DESCRIPTION

A current sensor includes plural sensor elements. A current path and a magnetic detector are stacked in each of the sensor elements. The plural sensor elements are disposed adjacently to each other in a direction perpendicular to the stacking direction. In consideration of easiness of assembly of an attachment target or the like, the current sensor may have the current path formed in a bent shape. Thus, the current path may include a facing part facing the magnetic detector, and a bent part bending toward the magnetic detector from the facing part.

In this situation, at the region closer to the magnetic detector with respect the facing part in the current sensor, a magnetic field generated from the facing part with a current flowing through the current path and a magnetic field generated from the bent part with a current flowing through the current path are intensified. Thus, the intensified magnetic fields may affect the magnetic detector in the adjacent sensor element in the current sensor. Hence, the detection accuracy may be lowered.

In one or more embodiments of the present disclosure, a current sensor inhibits a decrease in detection accuracy.

A current sensor according to an aspect of the present disclosure includes plural sensor elements. Each sensor element includes a current path, a magnetic detector, a first magnetic shield, and a second magnetic shield. The magnetic detector is disposed to face a part of the current path, and includes a magnetic detection element, which detects a magnetic field generated from the current path with a current flowing through the current path and converts the detected magnetic field to an electrical signal. The first magnetic shield and the second magnetic shield, which is paired with the first magnetic shield, face to each other. The first magnetic shield and the second magnetic shield are configured to inhibit a disturbance magnetic field toward the magnetic detector. The part of the current path and the magnetic detector are positioned between the first magnetic shield and the second magnetic shield. The second magnetic shield, the current path, the magnetic detector and the first magnetic shield are stacked in order along a stacking direction in the sensor element. The sensor elements are disposed adjacently to each other in a direction perpendicular to the stacking direction. The current path includes a facing part facing the magnetic detector and a bent part bending from the facing part toward the second magnetic shield without bending toward the first magnetic shield.

The current path includes: the facing part that faces the magnetic detector; and the bent part that is bent from the facing part toward the second magnetic shield without bending toward the first magnetic shield. In a region between the facing part and the first magnetic shield, the magnetic field generated from the facing part with a current flowing through the current path and the magnetic field generated from the bent part with a current flowing through the current path are cancelled out. Therefore, it is possible to inhibit a situation in which the magnetic field generated in the region between the facing part and the first magnetic shield affects the magnetic detector in the adjacent sensor element. It is possible to inhibit a decrease of the detection accuracy caused by an inflow of the magnetic field from the adjacent sensor element.

Hereinafter, multiple embodiments of the present disclosure will be described with reference to the drawings. In each embodiment, parts corresponding to those described in one or more preceding embodiment are denoted by the same reference numerals, and redundant descriptions will be omitted in some cases. In each embodiment, in a case where only a part of the configuration is described, the other parts of the configuration may be referred to the preceding embodiment.

Hereinafter, three directions perpendicular to each other are denoted by an X direction, a Y direction, and a Z direction. A plane defined by the X direction and the Y direction is referred to as an XY plane. A plane defined by the X direction and the Z direction is referred to as an XZ plane. A plane defined by the Y direction and the Z direction is referred to as a YZ plane. The Z direction corresponds to a stacking direction.

The following describes a current sensor 100 according to the present embodiment with reference to FIGS. 1 to 6. A circuit board 20 and a housing 50 are not illustrated in FIGS. 5 and 6 for simplicity.

Figure 4:
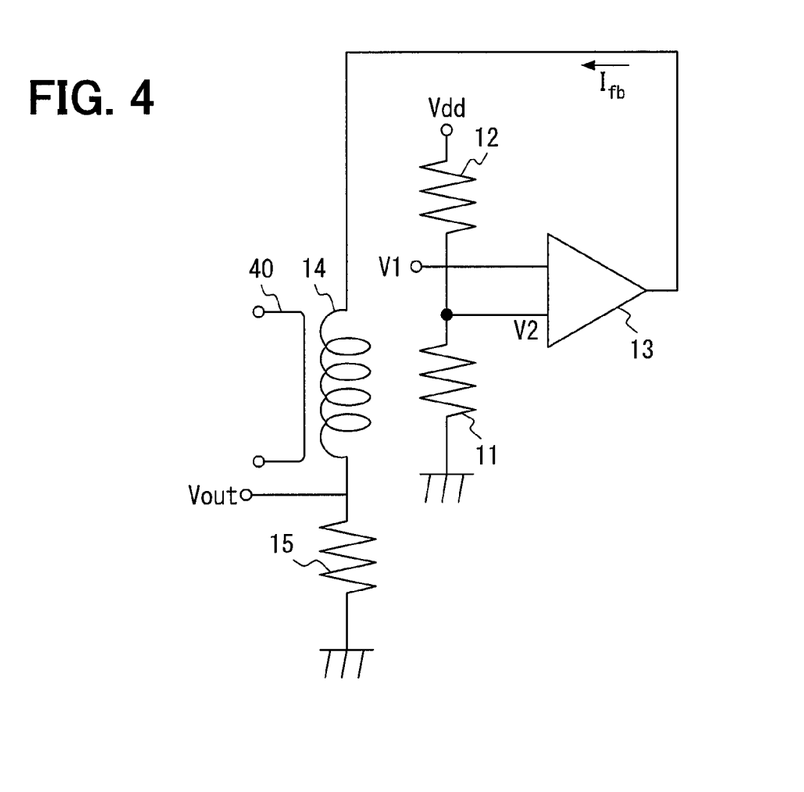
FIG. 4 is a circuit diagram that illustrates a schematic configuration of the current sensor according to the embodiment.

As shown in FIG. 4, the current sensor 100 utilizes a magnetic balance type current sensor as an example. The current sensor 100 may utilize, for example, a coreless current sensor that does not require a magnetic core. The circuitry configuration of the current sensor 100 will be described.

The current sensor 100 may be applied to a system including a boost circuit, two inverters, and two motor generators (hereinafter referred to as motors). In other words, the current sensor 100 is mounted to a vehicle along with a boost circuit with a reactor, two inverters for converting a DC power boosted by the boost circuit to a three-phase AC power, and two motors operated by an application of the three-phase AC power from the respective inverters.

The current sensor 100 detects a current flowing between the inverter and motor and a reactor and a current flowing through the reactor. More specifically, the current sensor 100 individually detects a current flowing through each of six bus bars 44 electrically connected to the inverter and the motor, and detects a reactor current flowing to the other bus bar 40.

The current sensor 100 includes a first sensor phase P1, a second sensor phase P2 and a third sensor phase P3 corresponding to a first group of the inverter and the motor. The current sensor 100 also includes a fourth sensor phase P4, a fifth sensor phase P5 and a sixth sensor phase P6 corresponds to a second group of the inverter and the motor. The current sensor 100 includes a reactor current phase IL for detecting the reactor current. Each of the sensor phases P1 to P6 corresponds to a sensor element. The present disclosure may not include the reactor current phase IL. The sensor phase may also be called a sensor element.

The first sensor phase P1, the second sensor phase P2 and the third sensor phase P3 correspond to V-phase, U-phase and W-phase in the first group of the inverter and the motor, and are provided to individually detect a current flowing through the corresponding phase between the inverter and the motor. Similarly, the fourth sensor phase P4, the fifth sensor phase P5 and the sixth sensor phase P6 correspond to V-phase, U-phase and W-phase in the second group of the inverter and the motor, and are provided to individually detect a current flowing through the corresponding phase between the inverter and the motor. The current sensor 100 detects a current flowing through the bus bar 40 as a current path.

In the system of the present embodiment, even when an error occurs in a current detection result in any of the three sensor phases P1 to P3, the operation is not easily affected as long as there is no error in the respective results of current detection at other two phases. The same applies to the three sensor phases P4 to P6. Therefore, it is unnecessary to redundantly dispose two magnetic detectors 10 for one bus bar at each of three sensor phases P1 to P3 or at each of three sensor phases P4 to P6.

The present embodiment utilizes the current sensor 100 including six sensor phases P1 to P6 and a reactor current phase IL, as an example. However, the present disclosure is not limited to this type of current sensor. The current sensor may include plural phases, in other words, two or more sensor phases.

Figure 1:
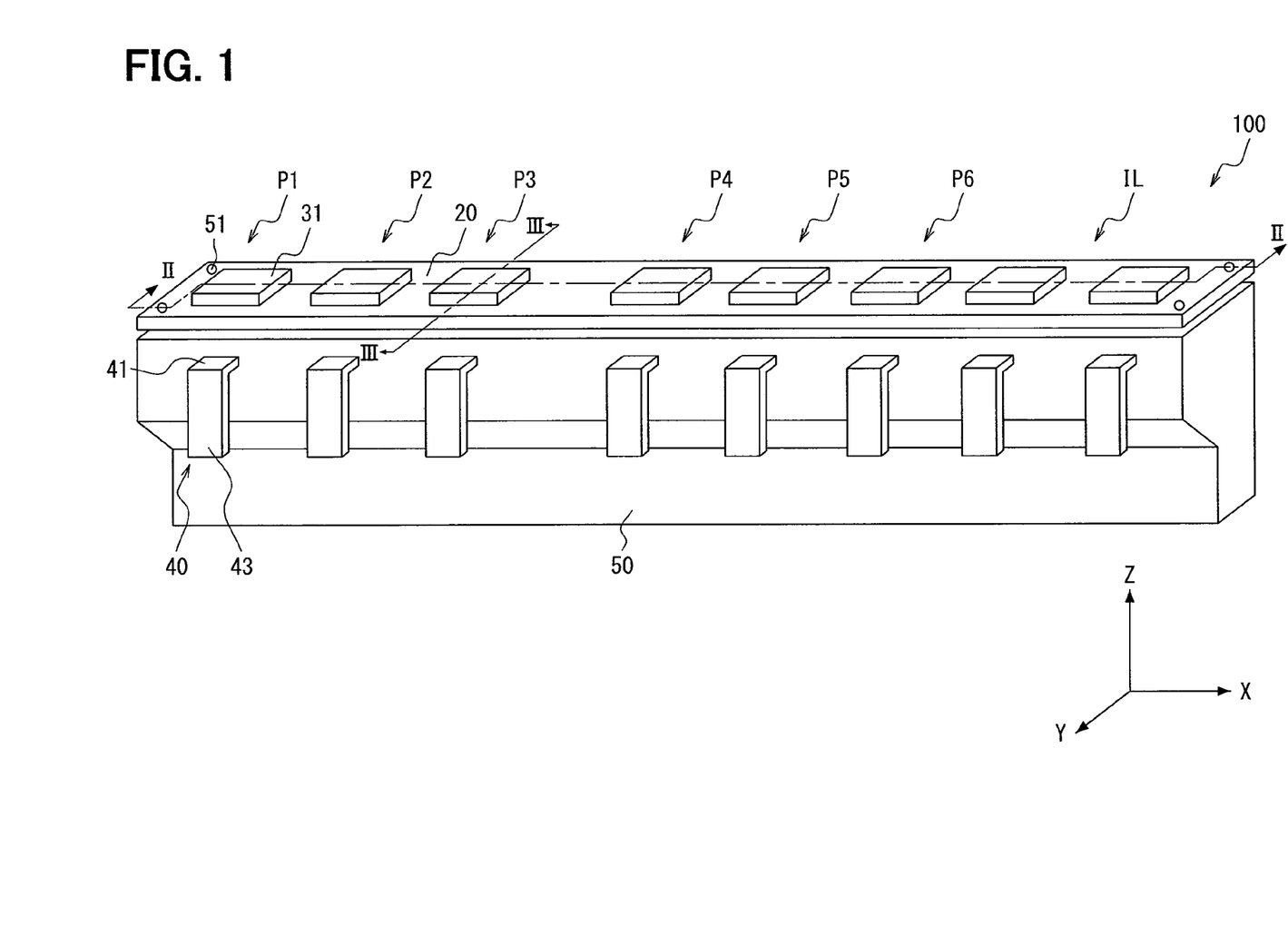
FIG. 1 is a perspective view that illustrates a schematic configuration of a current sensor according to an embodiment.
Figure 2:
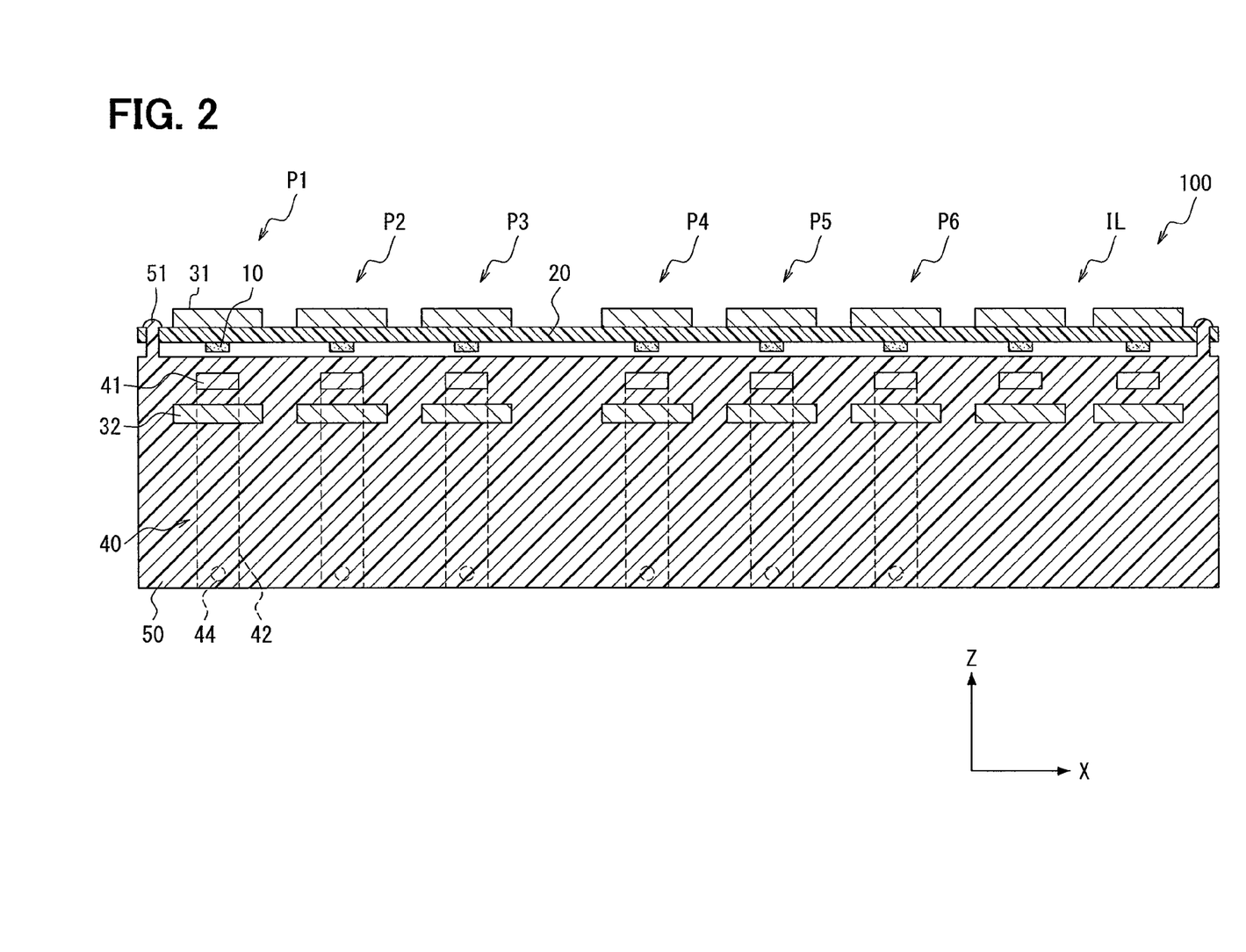
FIG. 2 is a cross-sectional view taken along a line II-II of FIG. 1.
Figure 3:
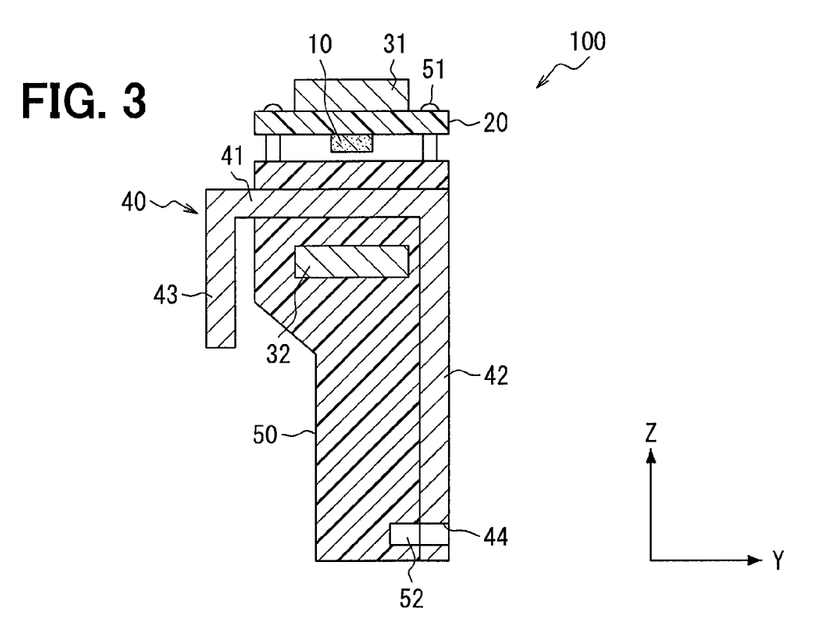
FIG. 3 is a cross-sectional view taken along a line III-III of FIG. 1.

As shown in FIGS. 1 to 3, the current sensor 100 includes, for example, a magnetic detector 10, a first magnetic shield 31, a second magnetic shield 32, a bus bar 40, a circuit board 20 and a housing 50. The current sensor 100 includes plural phases (or plural sensor elements), and each of the phases includes the bus bar 40, the magnetic detector 10, the first magnetic shield 31, and the second magnetic shield 32. The second shield 32, the bus bar 40, the magnetic detector 10 and the first magnetic shield 31 are stacked in order in each of the phases. The present embodiment utilizes the current sensor 100 including six sensor phases P1 to P6 and a reactor current phase IL, as an example. Thus, the current sensor 100 includes eight magnetic detector 10, eight first magnetic shields 31 and eight second magnetic shields 32.

In the current sensor 100, one bus bar 40 is provided for each of the sensor phases P1 to P6. Moreover, the current sensor 100 is provided with, for example, one U-shaped bus bar 40 at the reactor current phase IL. The bus bar 40 at each of the sensor phases P1 to P6 corresponds to a current path.

As shown in FIG. 2, the sensor phases P1 to P6 are disposed adjacent to each other in a direction perpendicular to the stacking direction. An example, in which the sensor phases P1 to P6 are disposed side by side in the X direction, is adopted. In other words, the sensor phases P1 to P6 are disposed at the corresponding facing parts 41 to be parallel with a direction of current flow (for example, Y direction). The first magnetic shields 31 of the respective sensor phases P1 to P6 are at the same position viewed in the Z direction, and are at the same position viewed in the Y direction. However, the first magnetic shields 31 are respectively at different positions viewed in the X direction. The same situation applies to the magnetic detector 10, the second magnetic shield 32 and the bus bar 40. With regard to the bus bar 40, the position in the Z direction and the position in the Y direction of each part of the bus bar are the same. However, the position in the X direction of each part of the bus bar is distinct.

The sensor phases P1 to P6 have the same configuration. FIG. 3 utilizes the third sensor phase P3 as a representative example. The third sensor P3 includes the magnetic detector 10, the first magnetic shield 31, the second magnetic shield 32 and the bus bar 40. The magnetic detector 10 is disposed to face a part of the bus bar 40. The magnetic detector 10 includes a magnetic detection element 12 that detects a magnetic field generated from the bus bar 40 with a current flowing through the bus bar 40, and converts the detected magnetic field into an electrical signal. The circuitry configuration of the magnetic detector 10 will be described.

The first magnetic shield 31 and the second magnetic shield 32 each is made of magnetic material. The first magnetic shield 31 and the second magnetic shield 32 are formed in a pair, and shield the magnetic field from outside toward the magnetic detector 10. The first magnetic shield 31 and the second magnetic shield 32 are disposed to be facing to each other, while the facing part 41 as a part of the bus bar 40 and the magnetic detector 10 are inserted between the first magnetic shield 31 and the second magnetic shield 32. In other words, the first magnetic shield 31 and the second magnetic shield 32 are disposed to face to each other with a gap in the Z direction, and are disposed such that the magnetic detector 10 or the facing part 41 is inserted between the first magnetic shield 31 and the second magnetic shield 32. At least a part of the facing part 41 or the magnetic detector 10 is disposed in the opposing region formed between the first magnetic shield 31 and the second magnetic shield 32.

The present embodiment utilizes the first magnetic shield 31 and the second magnetic shield 32 each having a thickness in the Z direction and a rectangular shape in the XY plane. Each of the magnetic shield 31 and 32 is a plate member. Each of the magnetic shields 31, 32 is configured by, for example, laminating plate magnetic material. As shown in FIGS. 2 and 3, each of the magnetic shields 31 and 32 has a size that enables to cover the opposing region of the magnetic detector 10 and the opposing region of the facing part 41.

Each of the magnetic shields 31, 32 has a flat surface along the XY plane, and is provided to be parallel to the XY plane. Since the magnetic shields 31, 32 are disposed to be parallel to each other, the magnetic shields 31, 32 are parallel plate shields. The magnetic shields 31, 32 are not only limited to the configuration described herein.

The outside refers to an outer side of the opposing region formed between the first magnetic shield 31 and the second magnetic shield 32. In other words, the first magnetic shield 31 and the second magnetic shield 32 inhibit a situation where disturbance magnetic field is applied to the magnetic detector 10. The first magnetic shield 31 and the second magnetic shield 32 do not shield the magnetic field between the magnetic detector 10 and the bus bar 40. The magnetic detector 10 and the bus bar 40 are between the first magnetic shield 31 and the second magnetic shield 32. The first magnetic shield 31 and the second magnetic shield 32 do not shield the magnetic field, which is a detected target of the magnetic detector 10.

The magnetic detectors 10 and the first magnetic shields 31 are mounted on the circuit board 20. The circuit board 20 is obtained by forming a conductor wiring on an electrically insulating base material such as resin or ceramics. The circuit board 20 has, for example, a rectangular parallelepiped shape. The circuit board 20 is formed with, for example, a through hole as a part for fixing the circuit board 20 to the housing 50. A fixing part 51 provided at the housing 50 is inserted into the through hole of the circuit board 20, and thus the circuit board 20 is fixed with the housing 50. However, the respective configurations of the circuit board 20 and the housing 50 are not limited to the above description.

The circuit board 20 has a first surface and a second surface, which is opposed to the first surface. The magnetic detectors 10 are provided on the first surface. The first magnetic shields 31 are provided on the second surface. In other words, the magnetic detectors 10 are formed on the surface of the circuit board 20 facing the housing 50 at which the bus bars 40 are provided. The magnetic detector 10 and the first magnetic shield 31 are disposed to face each other with the circuit board 20 located between the magnetic detector 10 and the first magnetic shield 31.

As shown in FIG. 4, the present embodiment utilizes the magnetic detector 10 including, for example, a first resistor 11, a magnetic detection element 12, an operational amplifier 13, a feedback coil 14, and a second resistor 15. The circuit board 20 is provided with a circuit shown in FIG. 4 that corresponds to each of the sensor phases P1 to P6 and the reactor current phase IL. The present embodiment utilizes the magnetic balance type current sensor 100.

In the magnetic detector 10, the first resistor 11 and the magnetic detection element 12 are connected in series between a power supply Vdd and a ground. The magnetic detection element 12 detects a magnetic field (inductive magnetic field) generated from the bus bar 40 with a current flowing through the bus bar 40 and converts the detected magnetic field into an electrical signal. For example, a giant magnetoresistance effect element (GMR), an anisotropic magnetoresistance effect element (AMR), a tunneling magnetoresistance effect element (TMR), or a Hall element may be utilized as the magnetic detection element 12.

The operational amplifier 13 corresponds to a supply device. The operational amplifier 13 is applied with a voltage V2, which is between the first resistor 11 and the magnetic detection element 12, and a reference voltage V1. When the reference voltage V1 and the voltage V2 are applied to the operational amplifier 13, the operational amplifier 13 supplies a feedback current Ifb to a feedback coil 14. The feedback current Ifb is used for the feedback coil 14 to form a cancellation magnetic field. The feedback current Ifb corresponds to a cancellation current.

The feedback coil 14 corresponds to an electromagnet. The feedback coil 14 is connected to the second resistor 15 in series between the output terminal of the operational amplifier 13 and the ground. The feedback coil 14 is disposed to face the bus bar 40, and generates a cancellation magnetic field for cancelling the magnetic field detected by the magnetic detection element 12. The feedback coil 14 generates a cancellation magnetic field when the feedback current Ifb flows. The magnetic field detected by the magnetic detection element is an inductive magnetic field generated from the bus bar 40 with a current flowing through the bus bar 40.

The operational amplifier 13 controls the feedback current Ifb such that the cancellation magnetic field generated from the feedback coil 14 and the inductive magnetic field generated from the bus bar 40 are cancelled out so that the reference voltage V1 is equal to the voltage V2. The current sensor 100 may detect a current flowing through the bus bar 40 based on the feedback current Ifb. In other words, the current sensor 100 may detect a current flowing through the bus bar 40 based on an output voltage Vout between the feedback coil 14 and the second resistor 15 in the magnetic detector 10.

The present embodiment utilizes an example in which the magnetic detector 10, the first magnetic shield 31, the second magnetic shield 32 and the bus bar 40 are integrally configured with the circuit board 20 or the housing 50. However, the present disclosure is not limited thereto.

The housing 50 is configured by, for example, resin. As shown in FIGS. 1 to 3, the housing 50 integrally holds the second magnetic shields 32 and the bus bars 40. The housing 50 integrally holds the second magnetic shields 32 and the bus bars 40 by, for example, insert molding. As shown in FIGS. 2 and 3, each of the second magnetic shields 32 is in a positional relationship such that a part of the housing 50 and the magnetic detectors 10 face to each other with the facing part 41 as a part of the bus bar 40 inserted between the part of the housing 50 and the magnetic detector 10.

The bus bar 40 connects the inverter and the motor. As shown in FIGS. 1, 2, 3, the bus bar 40 has a shape in which a conductive plate member is bent. The bus bar 40 includes the facing part 41, a first terminal part 42, a second terminal part 43, which are configured as a single body. For example, the first terminal part 42 has a first screw hole 44.

The facing part 41 is a part facing the magnetic detector 10, and is a part provided between the first magnetic shield 31 and the second magnetic shield 32. The facing part 41 is a flat part, and is provided to be parallel to the XY plane. At least a portion of the facing part 41 is accommodated in a housing 50.

The facing part 41 has a first end portion where the first terminal part 42 is provided, and has a second end portion where the second terminal part 43 is provided. Thus, the facing part 41 is a part provided between the first terminal part 42 and the second terminal part 43.

The first terminal part 42 corresponds to a bent part or a first bent part. The first terminal part 42 may be, for example, a terminal at a motor. As shown in FIG. 3 or the like, the first terminal part 42 is a part that is bent from the facing part 41 toward the second magnetic shield 32, but not toward the first magnetic shield 31. The present embodiment utilizes the first terminal part 42 that is bent at a right angle with respect to the facing part 41.

The first terminal part 42 includes a part facing one of side surfaces of the second magnetic shield 32. The first terminal part 42 includes a part that overlaps with the second magnetic shield 32 in a direction perpendicular to the stacking direction. In other words, the first terminal part 42 does not include a part that overlaps with the magnetic detector 10 in a direction perpendicular to the stacking direction. As shown in FIG. 2, the first terminal parts 42 in the respective sensor phases P1 to P6 are disposed to be in parallel to each other at the XZ plane.

A first screw hole 44 is provided at the first terminal part 42. The first screw hole 44 penetrates in the thickness direction so as to be electrically and mechanically connected to the motor. As shown in FIG. 3, the first terminal part 42 is embedded in the housing 50 with an outer surface of the first terminal part 42 exposed from the housing 50.

A second screw hole 52 is provided at a position of the housing 50 facing the first screw hole 44. The current sensor 100 is electrically and mechanically connected to the motor by inserting screws into the respective first screw hole 44 and the second screw hole 52.

The second terminal part 43 corresponds to a second bent part. The second terminal part 43 may be, for example, a terminal provided at an inverter. As shown in FIG. 3 or the like, the second terminal part 43 is a part that is not bent from the facing part 41 to the first magnetic shield 31. The second terminal part 43 is a part that is bent from the facing part 41 to the second magnetic shield 32. The present embodiment utilizes the second terminal part 43 that is bent at a right angle with respect to the facing part 41.

The second terminal part 43 includes a part that faces one of the side surfaces of the second magnetic shield 32. In other words, the second terminal part 43 includes a part that overlaps with the second magnetic shield 32 in a direction perpendicular to the stacking direction. In other words, the second terminal part 43 does not include a part that overlaps with the magnetic detector 10 in a direction perpendicular to the stacking direction.

The bus bar 40 has the first terminal part 42 and the second terminal part 43 that are provided to be in parallel to each other. In other words, the bus bar 40 has the first terminal part 42 and the second terminal part 43 which are parallel to each other at the YZ plane.

As shown in FIG. 3, the second terminal part 43 is provided at an end portion of the facing part 41 whose outer surface protrudes from the housing 50. The second terminal part 43 is not embedded in the housing 50.

Figure 8:
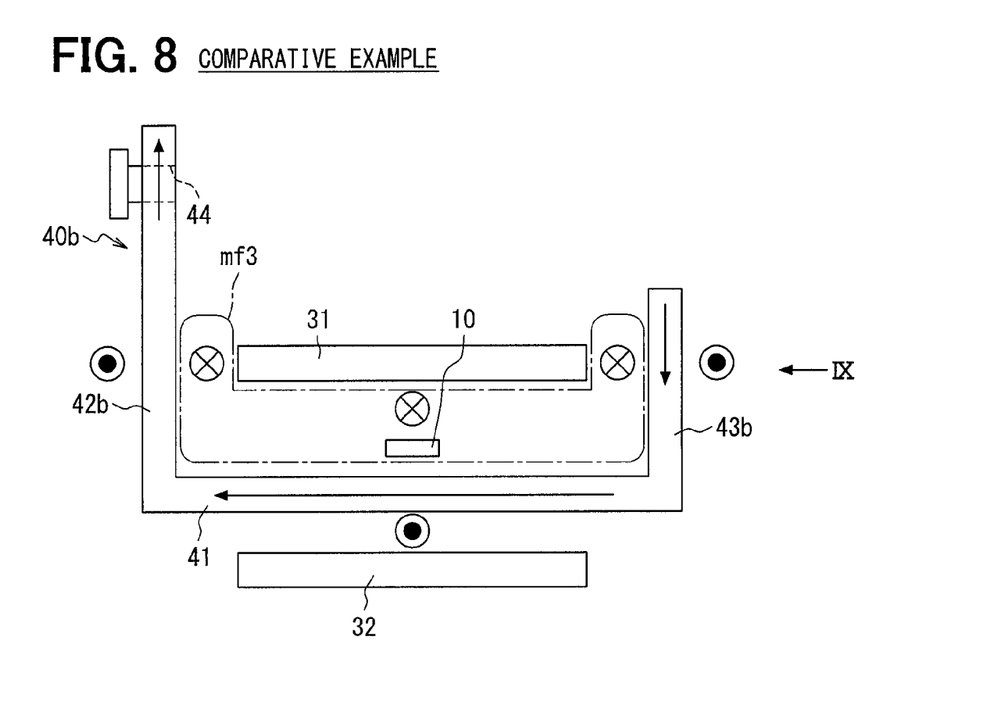
FIG. 8 is a plan view that illustrates a relationship between a bus bar and a magnetic field in a current sensor in a comparative example.
Figure 9:
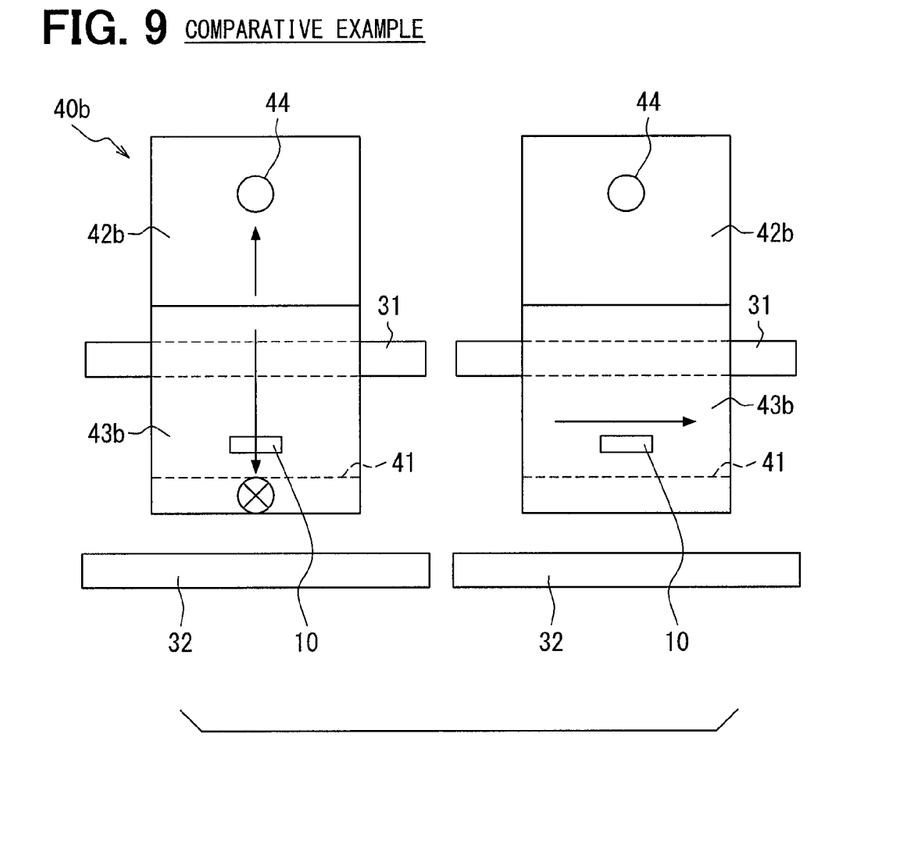
FIG. 9 is a plan view in a direction of an arrow IX in FIG. 8.

The following describes the effects of the current sensor 100 with the use of a current sensor in a comparative example shown in FIGS. 8, 9. For the configuration elements in the comparative example, the parts that are identical to those of the current sensors are denoted by the same reference numerals. Although the comparative example includes plural sensor phases similar to the current sensor 100, the configuration of the bus bar 40b in the comparative example is different from the bus bar in the current sensor 100. Each sensor phase includes the magnetic detector 10, the magnetic shield 31, the second magnetic shield 32 and a bus bar 40b.

The bus bar 40b includes the facing part 41, a first terminal part 42b and a second terminal part 43b. The first terminal part 42b and the second terminal part 43b are bent from the facing part 41 toward the first magnetic shield 31, but not toward the second magnetic shield 32.

In the comparative example, as indicated by a third magnetic field mf3 in FIG. 8, the magnetic field generated from the facing part 41 with a current flowing through the bus bar 40b and the magnetic field generated from the first terminal part 42b and the second terminal part 43b with a current flowing through the bus bar 40b are intensified. In other words, in the comparative example, the magnetic fields are intensified in the region between the bus bar 40b and the first magnetic shield. In the comparative example, as indicated by an arrow direction from left to right in FIG. 9, the magnetic field intensified at a left sensor phase flows into a right sensor phase.

As a result, the right sensor phase detects the magnetic field generated from the bus bar 40b and the magnetic field from the left sensor phase. The detection accuracy decreases at the right sensor phase due to an influence of the magnetic field from the left sensor phase. In other words, an error occurs in a detected value of the right sensor phase.

Figure 5:
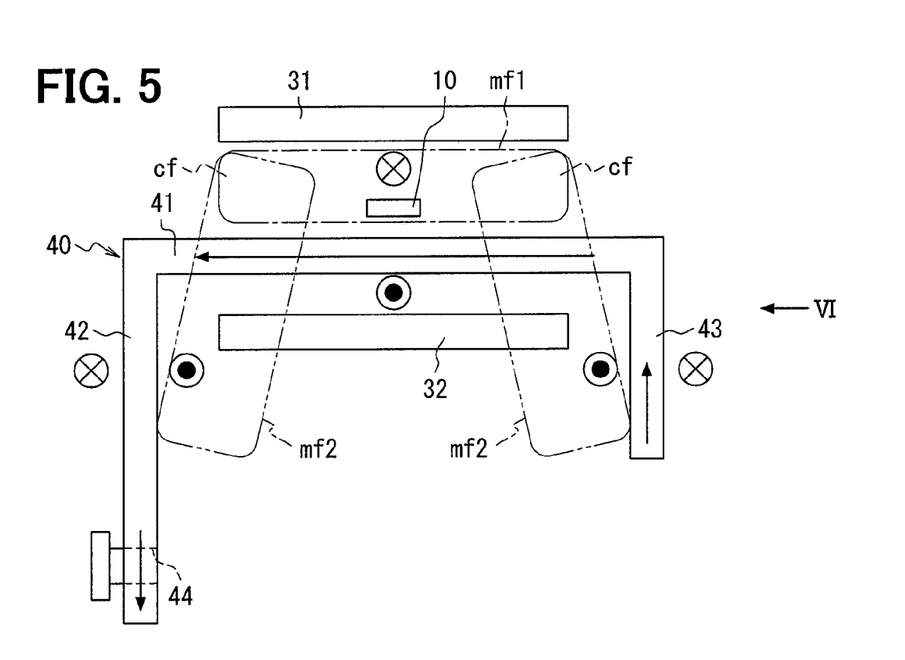
FIG. 5 is a plan view that illustrates a relationship between a bus bar and a magnetic field in the current sensor according to the embodiment.
Figure 6:
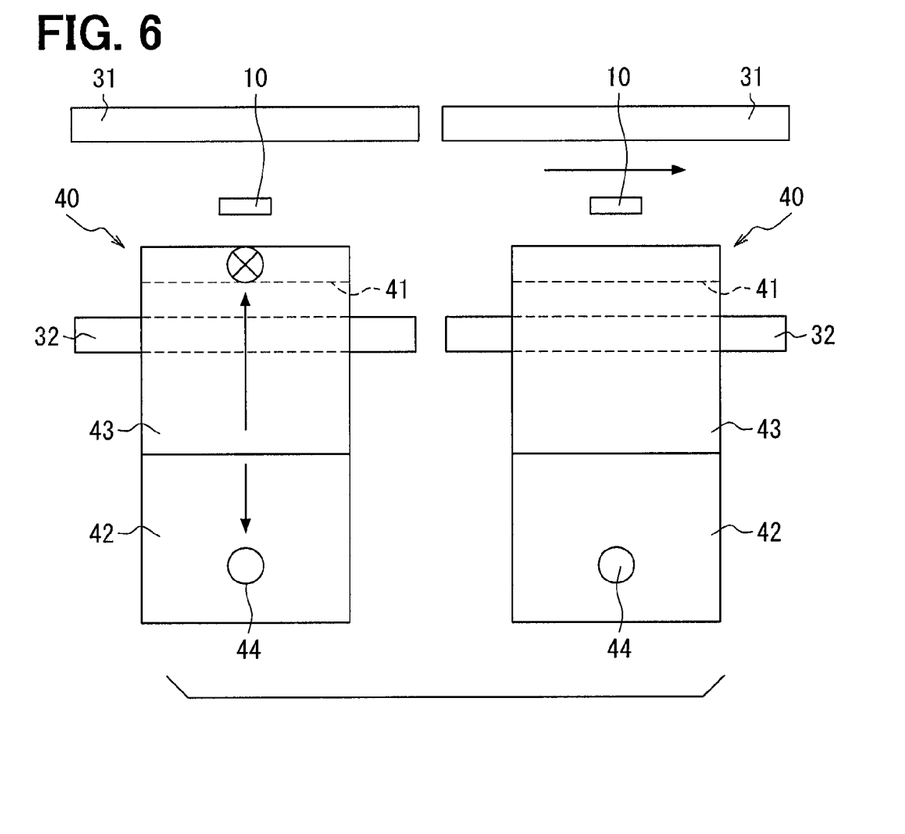
FIG. 6 is a plan view in a direction of an arrow VI in FIG. 5.

On the other hands, the current sensor 100 includes the bus bar 40. The bus bar 40 has the facing part 41 and the first terminal part 42. The facing part 41 faces the magnetic detector 10. The first terminal part 42 is bent from the facing part 41 toward the second magnetic shield 32, but not toward the first magnetic shield 31. As shown in FIG. 5, in the current sensor 100, a magnetic field mf1 is generated from the facing part 41 with a current flowing through the bus bar 40 at a region between the facing part 41 and the first magnetic shield 31. As shown in FIG. 5, in the current sensor 100, a second magnetic field mf2 is generated from the first terminal part 42 with a current flowing through the bus bar 40 at a region between the facing part 41 and the first magnetic shield 31.

In the current sensor 100, the magnetic field generated from the facing part 41 with a current flowing through the bus bar 40 and the magnetic field generated from the first terminal part 42 with a current flowing through the bus bar 40 are cancelled out at the region between the facing part 41 and the first magnetic shield 31. In other words, two magnetic fields are cancelled out at a cancellation field cf in the current sensor 100. The cancellation field may also be called as a cancellation region. It is noted that the cancellation field cf, the first magnetic field mf1, the second magnetic field mf2 and the third magnetic field mf3 are imaginary.

As compared with the comparative example, the current sensor 100 may inhibit a situation in which the magnetic field generated at the region between the facing part 41 and the first magnetic shield 31 affects the magnetic detector 10 at an adjacent sensor phase. In other words, as compared with the comparative example, the current sensor 100 may inhibit an inflow of the magnetic field to the adjacent sensor phase indicated by an arrow direction from left to right in FIG. 6. As compared with the comparative example, the current sensor 100 may inhibit a decrease in the detection accuracy due to the magnetic field flowing from the adjacent sensor phase. In other words, it is possible to inhibit a situation in which an error occurs at a detected value of the right sensor phase. The current sensor 100 includes the bus bar 40 having a shape that is difficult to receive the inflow of the magnetic field from the adjacent sensor phase.

The present embodiment utilizes the current sensor 100 includes the bus bar 40 having the second terminal part 43. The second terminal part 43 is bent from the facing part 41 toward the second magnetic shield 32, but not toward the second magnetic shield 32. Therefore, in the current sensor 100, the magnetic field mf1 generated from the facing part 41 with a current flowing through the bus bar 40 and the magnetic field mf2 generated from the first terminal part 42 with a current flowing through the bus bar 40 are cancelled out at the region between the facing part 41 and the first magnetic shield 31. In other words, in the current sensor 100, two magnetic fields are cancelled out in the cancellation field cf. Thus, the current sensor 100 may further inhibit a decrease in the detection accuracy.

With regard to the bus bar 40, the first terminal part 42 or the second terminal part 43 may not to be bent at a right angle with respect to the facing part 41. With regard to the bus bar 40, the first terminal part 42 or the second terminal part 43 may be bent from the facing part 41 toward the second magnetic shield 32, but not toward the first magnetic shield 31. Accordingly, it is possible that the current sensor 100 inhibits a decrease in the detection accuracy as compared with the comparative example.

Additionally, in the current sensor 100, the first terminal part 42 and the second terminal part 43 are not bent toward the circuit board 20 or the magnetic detector 10. Thus, with regard to the current sensor 100, it is easier to attach the circuit board 20 to the housing 50. The magnetic detector 10 is disposed at the circuit board 20. The bus bar 40 is disposed at the housing 50. In other words, with regard to the current sensor 100, it is possible to attach the circuit board 20 to the housing 50 without affecting spacing between the first terminal part 42 and the second terminal part 43. Moreover, with regard to the current sensor 100, the circuit board 20 is not disposed between the first terminal part 42 and the second terminal part 43. Therefore, it may be easy to maintain insulation distance between the bus bar 40 and the circuit board 20.

Since the current sensor 100 is a magnetic balance type current sensor 100, and the magnetic inflow from the adjacent phase is suppressed, it is possible to lower a feedback current Ifb for generating a cancellation magnetic field. Accordingly, it is possible for the current sensor 100 to save power consumption.

The present disclosure is not limited to the above-mentioned embodiment in any manner, and various modifications are possible within a scope that does not depart from the gist of the present disclosure.

(Modification)

Figure 7:
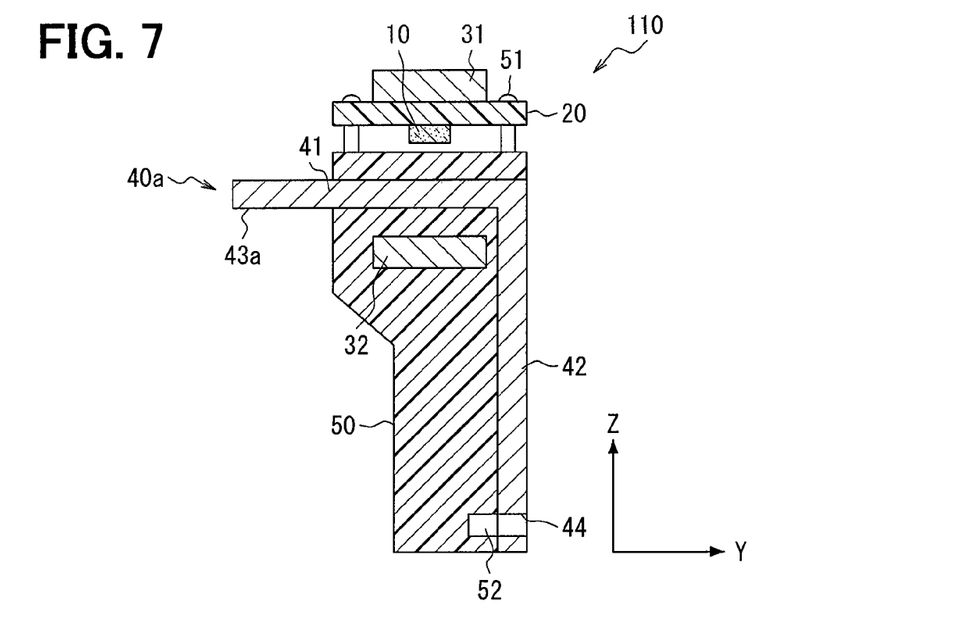
FIG. 7 is a cross-sectional view that illustrates a schematic configuration of a current sensor according to a modified example.

The following describes a current sensor 110 according to a modified example with reference to FIG. 7. The following describes the difference between the current sensor 100 and the current sensor 110. The current sensor 110 is different from the current sensor in the shape of the bus bar 40a. For the configuration elements in the current sensor 110, the parts similar to those of the current sensor 100 are denoted by the same reference numerals. The parts which are denoted by the same reference numerals may be referred to the above embodiments.

With regard to the bus bar 40a, a second terminal part 43a is not bent toward the facing part 41. In other words, the second terminal part 43a is provided in a linear shape with respect to the facing part 41. Even with such a configuration, the current sensor 110 is similar to the current sensor 100 such that the magnetic field generated from the facing part 41 and the magnetic field generated from the first terminal part 42 are cancelled out at the region between the facing part 41 and the first magnetic shield 31.

The current sensor 110 is similar to the current sensor 100 such that it is possible to inhibit a situation where an error occurs at a detected value while inhibiting a decrease in the detection accuracy, as compared with the comparative example. In other words, in the current path according to the present disclosure, at least one of the first terminal part and the second terminal part may be bent. According to the present disclosure, it is possible to inhibit a situation in which an error occurs at a detected value while inhibiting a decrease in the detection accuracy, as compared with the comparative example.

What is claimed is:

1. A current sensor comprising:
   a plurality of sensor elements, each sensor element including:
   a current path where current flows;
   a magnetic detector that is disposed to face a part of the current path, and includes a magnetic detection element configured to detect a magnetic field generated from the current path with a current flowing through the current path and convert the detected magnetic field to an electrical signal;
   a first magnetic shield; and
   a second magnetic shield which is paired with the first magnetic shield, the first magnetic shield and the second magnetic shield facing to each other,
   wherein the first magnetic shield and the second magnetic shield are configured to inhibit a disturbance magnetic field toward the magnetic detector,
   wherein the part of the current path and the magnetic detector are positioned between the first magnetic shield and the second magnetic shield,
   wherein the second magnetic shield, the current path, the magnetic detector and the first magnetic shield are stacked in order along a stacking direction in the sensor element,
   wherein the sensor elements are disposed adjacently to each other in a direction perpendicular to the stacking direction,
   wherein the current path includes
   a facing part facing the magnetic detector, and
   a first bent part bending toward the second magnetic shield from the facing part without bending toward the first magnetic shield,
   wherein the facing part of the current path has a first end and a second end,
   wherein the first bent part is disposed at the first end,
   wherein the current path further includes a second bent part at the second end, which is bent from the facing part toward the second magnetic shield without bending toward the first magnetic shield, and
   wherein the first bent part and the second bent part are parallel to each other.

2. The current sensor according to claim 1,
wherein the first bent part is bent at a right angle with respect to the facing part.

3. The current sensor according to claim 1,
wherein the second bent part is bent at a right angle with respect to the facing part.

4. The current sensor according to claim 1 further comprising:
an electromagnet that is configured to generate a cancellation magnetic field cancelling the magnetic field detected by the magnetic detection element; and
a supply device that is configured to supply to the electromagnet, a cancellation current generating the cancellation magnetic field, and
wherein the current flowing through the current path is detected based on the cancellation current.

5. The current sensor according to claim 1,
wherein the current path is a bus bar.

6. The current sensor according to claim 4,
wherein the supply device is an operational amplifier.

* * * * *